(12) United States Patent
Villmark

(10) Patent No.: US 11,083,101 B2
(45) Date of Patent: Aug. 3, 2021

(54) DATA SWITCH FOR UNDERWATER USE

(71) Applicant: SIEMENS ENERGY AS, Oslo (NO)

(72) Inventor: Trond Holger Villmark, Kongsberg (NO)

(73) Assignee: SIEMENS ENERGY AS, Oslo (NO)

( * ) Notice: Subject to any disclaimer, the term of this patent is extended or adjusted under 35 U.S.C. 154(b) by 130 days.

(21) Appl. No.: 16/061,711

(22) PCT Filed: Aug. 12, 2016

(86) PCT No.: PCT/EP2016/069218
§ 371 (c)(1),
(2) Date: Jun. 13, 2018

(87) PCT Pub. No.: WO2017/108214
PCT Pub. Date: Jun. 29, 2017

(65) Prior Publication Data
US 2018/0376607 A1 Dec. 27, 2018

(30) Foreign Application Priority Data

Dec. 22, 2015 (EP) ..................... 15202039

(51) Int. Cl.
*H05K 5/06* (2006.01)
*H05K 5/00* (2006.01)
(Continued)

(52) U.S. Cl.
CPC .............. *H05K 5/069* (2013.01); *H01H 9/04* (2013.01); *H04B 10/801* (2013.01); *H04L 49/40* (2013.01);
(Continued)

(58) Field of Classification Search
CPC .............. H01H 2009/0285; H01H 9/04; H04L 49/351; H04L 49/40; H05K 5/0069; H05K 5/069
See application file for complete search history.

(56) References Cited

U.S. PATENT DOCUMENTS 4,096,466 A * 6/1978 Johnson ................. H04B 1/44
200/61.05
4,682,848 A * 7/1987 Cairns ................. G02B 6/3816
385/69

(Continued)

OTHER PUBLICATIONS

Wang Jun et al; "Key technologies of junction boxes for Chinese experimental ocean observatory networks"; OCEANS 2015—MTS/IEEE Washington, MTS; pp. 1-5; XP032861575;; 2015.

(Continued)

*Primary Examiner* — William H. Mayo, III
*Assistant Examiner* — Rhadames Alonzo Miller
(74) *Attorney, Agent, or Firm* — Wolter Van Dyke Davis, PLLC

(57) ABSTRACT

A subsea data switch is provided. The subsea data switch includes a subsea housing, a data switching unit disposed in the subsea housing, and at least three termination assemblies for terminating at least three subsea cables) to the subsea data switch. In an embodiment, each subsea cable includes a data line, the data lines of the at least three subsea cables being connected to the data switching unit. The data switching unit is configured to provide data switching between the at least three connected data lines.

17 Claims, 2 Drawing Sheets

(51) Int. Cl.
*H01H 9/04* (2006.01)
*H04B 10/80* (2013.01)
*H04L 12/931* (2013.01)
*H01H 9/02* (2006.01)

(52) U.S. Cl.
CPC ... *H05K 5/0069* (2013.01); *H01H 2009/0285* (2013.01); *H04L 49/351* (2013.01)

(56) References Cited

U.S. PATENT DOCUMENTS

| | | | | |
|---|---|---|---|---|
| 4,696,540 | A * | 9/1987 | Adams | G02B 6/3878 385/66 |
| 4,747,094 | A * | 5/1988 | Sakaguchi | H04J 3/08 398/101 |
| 4,785,139 | A * | 11/1988 | Lynch | G02B 6/4465 138/121 |
| 5,012,457 | A * | 4/1991 | Mitchell | H04R 9/06 367/175 |
| 5,037,177 | A * | 8/1991 | Brown | G02B 6/3801 385/100 |
| 5,142,508 | A * | 8/1992 | Mitchell | G08B 21/082 367/141 |
| 5,301,959 | A * | 4/1994 | Gould | G02B 6/4428 277/606 |
| 5,684,911 | A * | 11/1997 | Burgett | G02B 6/4446 385/135 |
| 5,691,957 | A * | 11/1997 | Spiesberger | G01S 19/14 367/3 |
| 5,738,535 | A * | 4/1998 | Cairns | G02B 6/3816 439/138 |
| 6,017,227 | A * | 1/2000 | Cairns | G02B 6/3816 439/138 |
| 6,161,618 | A * | 12/2000 | Parks | E21B 33/0355 137/236.1 |
| 6,402,539 | B1 * | 6/2002 | Toth | H01R 13/443 439/138 |
| 6,442,304 | B1 * | 8/2002 | Crawley | E21B 47/011 385/12 |
| 6,538,198 | B1 * | 3/2003 | Woofers | E21B 17/206 138/111 |
| 7,621,229 | B2 * | 11/2009 | Bowen | B63G 8/001 114/244 |
| 8,340,526 | B2 * | 12/2012 | Camilli | H04B 10/272 398/104 |
| 8,634,690 | B2 * | 1/2014 | Landaas | G02B 6/4428 385/138 |
| 8,734,026 | B2 * | 5/2014 | Nagengast | G02B 6/3817 385/77 |
| 8,867,315 | B2 * | 10/2014 | Paul | F16L 11/086 367/173 |
| 8,899,841 | B2 * | 12/2014 | Cairns | G02B 6/4428 385/53 |
| 8,900,000 | B2 * | 12/2014 | Cairns | H01R 35/04 439/13 |
| 8,953,944 | B2 * | 2/2015 | Machado | H04B 13/02 398/104 |
| 9,116,323 | B2 * | 8/2015 | Cairns | G02B 6/4441 |
| 9,395,338 | B2 * | 7/2016 | Fucile | F03D 17/00 |
| 9,463,849 | B2 * | 10/2016 | McCabe | B63B 21/20 |
| 9,715,068 | B2 * | 7/2017 | Cairns | H01R 13/5205 |
| 10,375,939 | B2 * | 8/2019 | Partan | A01K 69/10 |
| 2003/0007738 | A1 * | 1/2003 | Cairns | G02B 6/3816 385/56 |
| 2003/0228783 | A1 * | 12/2003 | Cairns | H01R 13/523 439/204 |
| 2004/0262008 | A1 * | 12/2004 | Deans | E21B 41/0007 166/339 |
| 2006/0188202 | A1 * | 8/2006 | Deans | H04B 10/294 385/100 |
| 2008/0003868 | A1 * | 1/2008 | Cairns | H01R 13/523 439/552 |
| 2008/0144442 | A1 * | 6/2008 | Combee | G01V 1/38 367/131 |
| 2009/0288836 | A1 * | 11/2009 | Goodall | E21B 33/0385 166/336 |
| 2010/0008371 | A1 * | 1/2010 | Brekke | H04L 12/40006 370/401 |
| 2011/0280538 | A1 * | 11/2011 | Durrant | G02B 6/4448 385/138 |
| 2012/0263420 | A1 * | 10/2012 | Benton | G02B 6/3817 385/77 |
| 2013/0044983 | A1 * | 2/2013 | Nagengast | G02B 6/3817 385/77 |
| 2013/0307699 | A1 * | 11/2013 | Brekke | H04L 12/40032 340/850 |
| 2014/0035504 | A1 * | 2/2014 | Rongve | H02P 29/02 318/434 |
| 2014/0093247 | A1 * | 4/2014 | Jamtveit | G02B 6/3816 398/104 |
| 2014/0098468 | A1 * | 4/2014 | Boe | H02G 1/10 361/601 |
| 2014/0161536 | A1 * | 6/2014 | Berg | G02B 6/506 405/184.1 |
| 2014/0193125 | A1 * | 7/2014 | Durrant | G02B 6/506 385/94 |
| 2014/0233898 | A1 * | 8/2014 | Kimbrell | G02B 6/443 385/107 |
| 2014/0241810 | A1 * | 8/2014 | Lynch | F16L 53/38 405/170 |
| 2014/0270645 | A1 * | 9/2014 | Toth | G02B 6/3849 385/58 |
| 2015/0003916 | A1 * | 1/2015 | Rico Rubio | H02G 1/10 405/173 |
| 2016/0040968 | A1 * | 2/2016 | Jeng | F42B 19/01 114/312 |
| 2016/0057880 | A1 * | 2/2016 | Hanke | A01K 63/06 361/752 |
| 2016/0072284 | A1 * | 3/2016 | Stromsvik | H02H 7/04 307/17 |
| 2016/0266335 | A1 * | 9/2016 | Durrant | G02B 6/4448 |
| 2016/0365927 | A1 * | 12/2016 | Bjoerklund | H02G 15/14 |
| 2017/0003455 | A1 * | 1/2017 | Cairns | H02G 15/04 |
| 2017/0005448 | A1 * | 1/2017 | Williams | H01R 43/002 |
| 2017/0141548 | A1 * | 5/2017 | Stromsvik | H02B 7/06 |

OTHER PUBLICATIONS

Meese T. et al; "Medusa: the design and development of a TCP/IP communications nexus for the MOOS Portable Ocean Observatory Program"; Oceans, 2005; Proceedings of MTS/IEEE Washington DC, IEEE Piscataway NJ, USA; pp. 1-6; ISBN: 978-0-933957-34-3; DOI:10.1109/OCEANS.2005.1639946; XP010920896;; 2005.

Howe B. M. et al; "Sensor networks for cabled ocean observatories"; Underwater Technology, 2004. UT '04. 2004 International Symposium on Taipei, Taiwan; pp. 113-120; ISBN: 978-0-7803-8541-2; DOI:10.1109/UT.2004.1405499; XP010776331; Apr. 20-23, 2004, Piscataway, NJ, USA.IEEE,; 2004.

Wang I. et al; "Modular Hardware Infrastructure for Autonomous Underwater Vehicles"; pp. 1-4; Oceans, 2005. Proceedings of MTS/IEEE Washington, DC, USA Sep. 18-23, 2005, Piscataway, NJ, USA,IEEE, Piscataway, NJ, USA; ISBN: 978-0-933957-34-3; XP010921123;; 2005.

Phibbs P. et al; "NEPTUNE Stage I Network Architecture"; Underwater Technology and Workshop on Scientific Use of Submarine Cables and Related Technologies, 2007. Symposium on, IEEE, PI; pp. 179-184; ISBN: 978-1-4244-1207-5; DOI: 10.1109/UT.2007.370954; XP031176175;; 2007.

Walrod J. B.; Development and Installation of Networked Undersea Measurement Systems using the Advanced Telecom Computing Architecture (ATCA);Oceans 2007, IEEE, Piscataway, NJ, USA; pp. 1-7; XP031229167; 2007.

Chaffey et al; "Mbari's buoy based seafloor observatory design"; OCEANS 04, MTTS/IEEE Techno-Ocean 04; vol. 4; pp. 1975-1984; ISBN: 978-0-7803-8669-3; DOI:10.1109/OCEANS.2004.1406447; XP010776673; 2004.

(56) References Cited

OTHER PUBLICATIONS

Simpson Jim A.; "Underwater Free-Space Optical Communication Using Smart Transmitters and Receivers"; Dissertation; pp. i-xii + 1-140; XP055267929;; 2012.

Hazell N. J. et al; "Open Architecture Submarine Cable Observatory Systems"; Underwater Technology and Workshop on Scientific Use of Submarine Cables and Related Technologies, 2007. Symposiumon: pp. 199-205; ISBN: 978-1-4244-1207-5; DOI: 10.1109/UT.2007.370957; XP031176178; IEEE, PI; 2007.

Camilli Richard; "Creation and Deployment of the Nereus Autonomous Underwater Chemical Analyzer and Kemonaut, An Odyssey Class Submarine—0—"; MIT-Y-03-002 C2; MIT Sea Grant College Program; retrieved on Jun. 8, 2016 from the Internet: URL:https://eos.ucs.uri.edu/EOS Linked Documents/mit/mity03002/mity03002 full.pdf; pp. 21,27,43; p. 97; pp. 61,109; XP055278901;; 2003.

Moog Components Group; "922 High-Reliability Fiber-Optic Ethernet Switch"; Retrieved on May 24, 2016 from the Internet: URL:http://www.moog.com/products/multiplexers-media-converters/focal-multiplexer-product-line/market-specific-multiplexers/subsea-controls/922-fom.html; XP055275106;; 2014.

Lentz S. T.; "The NEPTUNE Canada Communications Network"; OCEANS 2007, IEEE, Piscataway, NJ, USA; pp. 1-5; XP031228993;; 2007.

PCT International Search Report and Written Opinion of International Searching Authority dated Nov. 17, 2016 corresponding to PCT International Application No. PCT/EP2016/069218 filed Aug. 12, 2016.

\* cited by examiner

DATA SWITCH FOR UNDERWATER USE

PRIORITY STATEMENT

This application is the national phase under 35 U.S.C. § 371 of PCT International Application No. PCT/EP2016/069218 which has an International filing date of Aug. 12, 2016, which designated the United States of America and which claims priority to European patent application number EP 15202039.2 filed Dec. 22, 2015, the entire contents of which are hereby incorporated herein by reference.

FIELD

Embodiments of the invention generally relate to a subsea data switch and/or to a subsea data communication cable harness.

BACKGROUND

Real time high speed communication between subsea installations and subsea to topside is highly wanted. Today, Ethernet communication is commonly used subsea with great success. The problem with Ethernet technology is the distance, copper wire communication is limited to normally less than 100 m. The subsea industry needs communication on longer distances, up to several km.

Up to now, communication on long distances has been solved by use of slow communication systems or an expensive, complicated and vulnerable system using fiber optic cable with stationary electronics and wet mateable optical connectors in each end.

The Oil & Gas industry presently uses copper cables to transmit electrical power and signals (communications) to subsea installations. However, communications transmitted by optical fiber will be the choice of most future developments. Designs for step-out wells or connections to new subsea facilities for distances over 20 km are now common. Requirements for over 60 km are becoming more frequent.

Signal transmission on standard CAT5 Ethernet (copper) cables is limited to a maximum of approximately 100 meters.

SUMMARY

The inventor notes that it is desirable to employ fiber optical technology to achieve high speed communication for longer distances in a subsea communication network.

The inventor has discovered that there is a need to improve subsea data communication, in particular between different subsea devices.

The claims describe embodiments of the invention.

According to at least one embodiment of the present invention, a subsea data switch is provided. The subsea data switch comprises a subsea housing, a data switching unit disposed in the subsea housing, and at least three termination assemblies for terminating at least three subsea cables to the subsea data transmission switch. In other words, at each termination assembly of the at least three termination assembly a corresponding subsea cable of the at least three subsea cables is terminated. Each subsea cable includes a data line, and the data lines of the at least three subsea cables are connected to the data switching unit. The data switching unit is configured to provide a data switching between the at least three connected data lines.

Furthermore, according to at least one embodiment of the present invention, a subsea data communication cable harness is provided. The subsea data communication cable harness comprises at least three subsea cables and the above-described subsea data switch. Each subsea cable includes a data line. The at least three subsea cables are terminated at the subsea data switch, and the at least three data lines are connected to the data switching unit of the subsea data switch. The subsea data communication cable harness preconfigured as described above, may be used to establish a data communication between a plurality of subsea, offshore and onshore devices.

DETAILED DESCRIPTION OF EXAMPLE EMBODIMENTS

Figure 1:
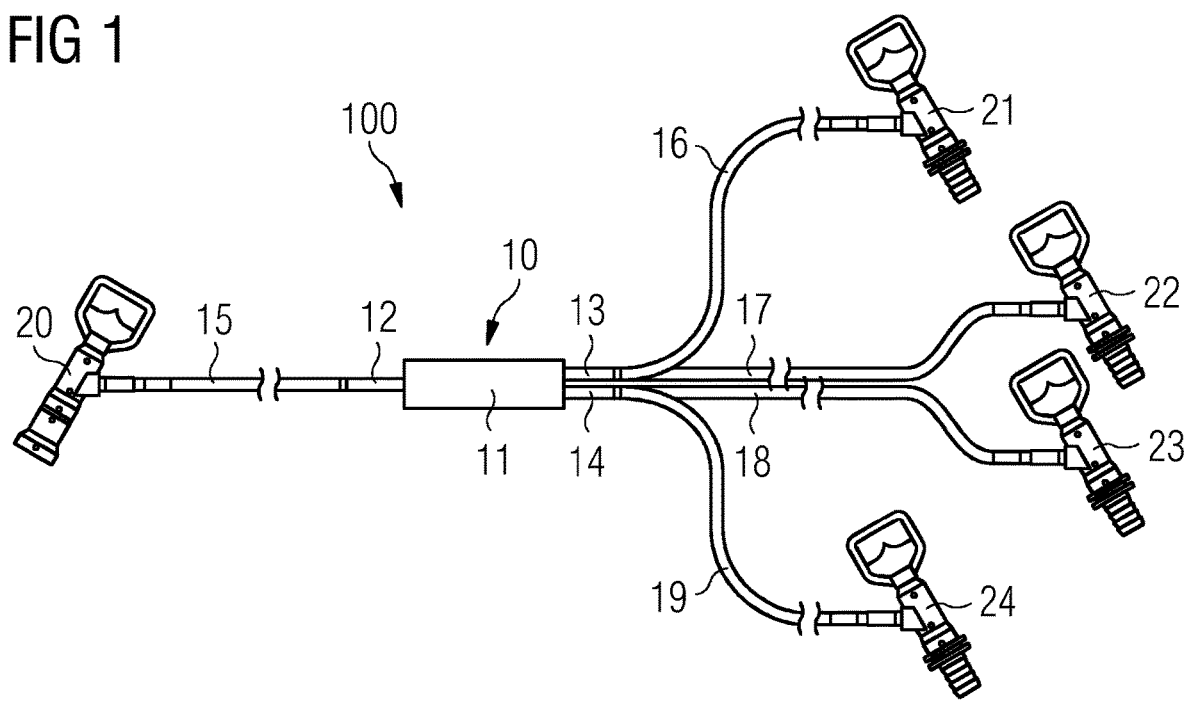
FIG. 1 shows schematically a configuration of a subsea data communication cable harness according to an embodiment.

According to at least one embodiment, the present invention, a subsea data switch is provided. The subsea data switch comprises a subsea housing, a data switching unit disposed in the subsea housing, and at least three termination assemblies for terminating at least three subsea cables to the subsea data transmission switch. In other words, at each termination assembly of the at least three termination assembly a corresponding subsea cable of the at least three subsea cables is terminated. Each subsea cable includes a data line, and the data lines of the at least three subsea cables are connected to the data switching unit. The data switching unit is configured to provide a data switching between the at least three connected data lines.

By way of the subsea data switch of at least one embodiment, a plurality of subsea devices can communicate efficiently without requiring a further subsea unit for communication distribution. Embodiments may provide communication between a variety of subsea devices. This includes communication between sensors and control systems subsea, as well as subsea to topside communication. By terminating the subsea cables directly at the termination assemblies at the subsea data switch, costly and bulky connectors may be avoided and a compact design of the subsea data switch may be achieved.

According to at least one embodiment, the data switching unit comprises an Ethernet switch and therefore the subsea data switch realizes an Ethernet data switch. Ethernet technology supports communication in a wide variety of applications such that the Ethernet data switch is versatility applicable.

The subsea data switch of at least one embodiment may comprise a printed circuit board with electronic circuits thereon. The printed circuit board may be disposed in the subsea housing and may provide at least part of the data switching unit. For example, the printed circuit board may provide units for converting optical signals into electrical signals and vice versa and may provide modular interfaces for optical fiber connections. The modular interfaces may be varied to support the required wavelengths or transmission modes, for example for supporting multimode or single mode fibers. Furthermore, the printed circuit board may provide units for a communication protocol conversion, for example for a protocol conversion between Ethernet and a customer specific protocol. Additionally, management, monitoring and statistics of the Ethernet functionality may be provided through an SNMP (Simple Network Management Protocol) server.

According to an embodiment, at least one of the data lines is a fiber optical data line. The data switching comprises a medium converter converting between an optical signal of the fiber optical data line and an electrical signal. Coupling of the fiber optical data line via the medium converter enables long distance data transmissions, for example distances in a range of 20 to 120 km.

According to at least one other embodiment, the subsea housing comprises at least a first chamber in which the data switching unit is disposed. The first chamber may be a pressure resistant chamber maintained at a predefined internal pressure. The predefined internal pressure may be below 10 bar, preferably below 2 bar, for example near one bar. Thus, the first chamber may be a so-called one atmosphere chamber in which standard components, for example standard electronic components and devices, may be operated. As an alternative, the first chamber may be a pressure compensated chamber in which the internal pressure is balanced to the pressure prevailing in an ambient environment of the first chamber, for example several hundred bar in case the subsea data switch is arranged subsea in a water depth of several hundred or even some thousand meters. A pressure compensated chamber may reduce the load exerted on seals in the termination assemblies when the subsea data switch is operated in subsea conditions. However, advanced requirements concerning high pressure resistance may have to be fulfilled by components arranged within the first chamber.

In case the first chamber is a pressure resistant chamber, the subsea data switch of at least one embodiment may comprise at least one penetrator having a glass to metal seal for leading an electrical data line into the first chamber, and additionally or as an alternative the subsea data switch may comprise at least one penetrator having a glass to glass seal for leading an optical data line into the first chamber. When terminating the subsea cables at the termination assemblies, the data lines included in the subsea cables may be introduced into the first chamber via the glass to metal seal or the glass to glass seal thus providing a reliable sealing even if a high pressure difference is existing between an inside and an outside of the first chamber.

The subsea data switch of at least one embodiment may comprise additionally a second chamber comprising a fiber management unit for an optical fiber of at least one of the data lines. The second chamber may be a pressure compensated chamber that is filled with a substantially incompressible medium. The incompressible medium may comprise for example a liquid or gel, for example oil. In the second chamber the internal pressure is balanced to the pressure prevailing in an ambient environment, for example prevailing in surrounding seawater when installed subsea. A corresponding pressure compensator may be arranged for balancing the internal pressure to the ambient pressure. The interior of the subsea cable including the data line is usually also pressure compensated such that the ambient pressure is also present inside the subsea cable. By providing the second chamber as a pressure compensated chamber, a load on seals of the termination assemblies may be reduced.

Furthermore, according to of at least one embodiment, at least one of the subsea cables is provided by a medium filled hose. The hose may be filled with a liquid or oil. In the hose the respective data line is disposed. The interior of the second chamber is in flow communication with the interior of the hose and is thereby pressure compensated via the hose. Thus, no specific pressure compensating device(s) is required for pressure compensating the second chamber.

According to another embodiment, at least one of the data lines is an electrical data line, for example an Ethernet data line. The data switching unit is supplied with electrical power over the electrical data line. For example, the data switching unit is supplied with electrical power over the Ethernet data line. By providing electrical power over the electrical data line, for example over the Ethernet data line, an additional dedicated power supply line is not required.

Additionally or as an alternative, at least one of the subsea cables of at least one embodiment may include powerlines for providing electrical power to the data switching unit. Thus, a reliable power supply can be provided for the subsea data switch independent of the use of the data lines.

According to another embodiment, the data switching unit comprises an Ethernet switch having at least four ports. For example, the at least four ports may include four electrical ports, or the at least four ports may include two electrical ports and two optical ports. In case the subsea data switch provides four electrical ports, the subsea data switch may be used for coupling devices which are arranged close to each other, for example within one site at a distance of less than 100 m. The subsea data switch comprising two electrical ports and two optical ports may be used in a configuration in which local devices of a subsea site are to be coupled to remote devices of remote sites. The optical ports may be used for connecting to the remote devices of the remote sites and the electrical ports may be used for connecting to the local devices.

According to another embodiment, the housing is a cylindrical housing extending in the longitudinal direction that is aligned with an axial direction of at least one of the subsea cables which is terminated to an end wall of the cylindrical housing. For example, an outer diameter of the housing may be smaller than 10 times an outer diameter of one of the subsea cables. Preferably, the outer diameter of the housing may be smaller than five times the outer diameter of the subsea cable. The cylindrical and compact housing design facilitates an easy handling of the subsea data switch during transportation and installation. For example, the subsea data switch may be lowered down to the seabed together with the connected subsea cables by a cable laying ship.

According to another embodiment, at least one of the at least three termination assemblies is configured for terminating at least one fiber optical subsea cable. Preferably, at least one of the at least three termination assemblies is configured for terminating two fiber optical subsea cables comprising fiber optical data lines. Furthermore, at least one of the at least three termination assemblies is configured for terminating at least one electrical subsea cable. Preferably, at least one of the at least three termination assemblies is configured for terminating at least two electrical subsea cables comprising electrical data lines. Terminating more than one subsea cable at a corresponding termination assembly allows a more compact design of for example the end walls of the cylindrical subsea housing.

According to another embodiment, at least one subsea cable of the at least three subsea cables comprises a hose surrounding the data line of the corresponding subsea cable. The termination assembly assigned to the subsea cable is configured to receive and terminate the hose and to pass the data line to the data switching unit. In particular, each subsea cable of the at least three subsea cables may comprise a corresponding hose surrounding the data line of the corresponding subsea cable. The corresponding termination assembly assigned to the corresponding subsea cable is configured to receive and terminate the corresponding hose and to pass the data line to the data switching unit. By directly terminating at least one or even all of the subsea cables at the termination assembly, bulky connectors may be avoided and a compact design of the subsea data switch may be facilitated. Furthermore, sources of errors, for example leakages or defective connectors, may be avoided.

Furthermore, according to at least one embodiment of the present invention, a subsea data communication cable harness is provided. The subsea data communication cable harness comprises at least three subsea cables and the above-described subsea data switch. Each subsea cable includes a data line. The at least three subsea cables are terminated at the subsea data switch, and the at least three data lines are connected to the data switching unit of the subsea data switch. The subsea data communication cable harness preconfigured as described above, may be used to establish a data communication between a plurality of subsea, offshore and onshore devices.

According to an embodiment, at least one or each of the subsea cables comprises at its remote end a corresponding subsea wet mateable connector. This enables the subsea data communication cable harness to be connected to a plurality of existing or newly deployed subsea, offshore and onshore devices.

It is to be understood that the features and embodiments described above may be used not only in the respective combinations indicated, but also in other combinations or in isolation without leaving the scope of the present invention.

In the following, example embodiments of the invention will be described in more detail. It is to be understood that the features of the various example embodiments described herein may be combined with each other unless specifically noted otherwise. Same reference signs in the various drawings and the following description refer to similar or identical components.

FIG. 1 shows an example configuration of a subsea data communication cable harness 100 in which five subsea cables 15 to 19 are terminated to a subsea data switch 10. These subsea cables 15 to 19 can be any combination of electrical and optical subsea cables. When only optical subsea cables are employed, then one subsea cable may comprise electrical conductors for the power supply of the subsea data switch 10. At a proximate end of each of the subsea cables 15 to 19 a corresponding wet mateable connector 20 to 24 may be provided for coupling the subsea cables 15 to 19 to subsea devices. As an alternative, the proximate end of the subsea cable 15 to 19 may be directly connected to a corresponding subsea device.

At a subsea housing 11 of the subsea data switch 10, the subsea cables 15 to 19 are terminated via termination assemblies 12 to 14. In the example shown in FIG. 1, the subsea cable 15 is terminated at termination assembly 12, the subsea cables 16 and 17 are terminated at the termination assembly 13, and the subsea cables 18 and 19 are terminated at the termination assembly 14. Thus, one, two or even more subsea cables may be terminated within one termination assembly.

As can be seen, with such harness 100, communication between different subsea devices can be achieved, in particular via Ethernet, without requiring any further separate subsea device, such as a subsea communication unit.

The subsea data switch 10 is designed for use in subsea environments. In particular, the subsea data switch 10 may be designed for use down to 3000 meters of seawater. This can either be done by installation in a one-atmospheric chamber, or in oil filled environment which is pressure compensated to ambient sea water.

Electronics for use in both pressurized oil and in a one-atmospheric chambers may be developed and qualified. Since active components in one-atmospheric chamber solutions have a good track record, this may be the preferred solution for the subsea data switch 10.

Figure 2:
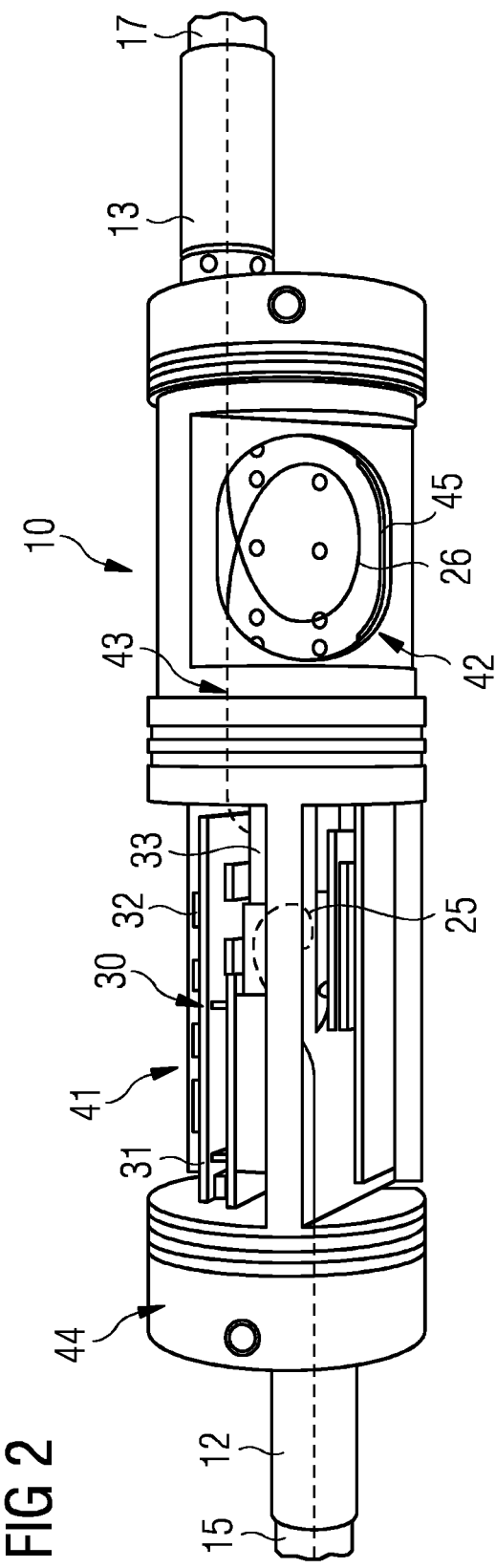
FIG. 2 is a schematic sectional view of a subsea data switch according to an embodiment.

FIG. 2 shows the subsea data switch 10 in more details. In the following, the subsea data switch 10 will also be called Advanced Converter and Switch (ACS).

In FIG. 2 a tubular part of the subsea housing 11 of the subsea data switch 10 is removed such that an internal structure of the subsea data switch 10 is visible. The subsea data switch 10 comprises first chamber 41, which is arranged at the left-hand side in FIG. 2, and the second chamber 42 which is arranged at the right-hand side in FIG. 2.

The first chamber 41 may be a pressure compensated chamber in which the internal pressure is balanced into the pressure prevailing in an ambient environment. However, preferably, the first chamber 41 is a pressure resistant chamber maintained at a predefined internal pressure, for example at the pressure below 10 bar, preferably at a pressure of 1 atm. A data switching unit 30, preferably an Ethernet data switch, is arranged within the first chamber 41. The data switching unit 30 comprises a printed circuit board 31 and electronic circuits 32 thereon.

The second chamber 42 may be pressure compensated such that a pressure inside the chamber 42 corresponds essentially to a pressure prevailing in an environment of the subsea data switch 10. In the second chamber 42 a fiber management unit 45 is arranged.

In FIG. 2, only two termination assemblies 12 and 13 are shown for clarity reasons. However, it is to be understood that for example at the right-hand side of the subsea data switch 10 two or more termination assemblies 13, 14 may be arranged as shown in FIG. 1.

A hose of the subsea cable 15 is terminated within the termination assembly 12 and a data line 25, for example a copper data line 25, is passed through the termination assembly 12 to the printed circuit board 31 of the data switching unit 30. The interior of the hose 15 may be filled with a fluid or gel and may be pressure compensated such that a pressure inside the hose corresponds essentially to a pressure prevailing in an environment. This may be a considerably high pressure in subsea environments. As described above, the first chamber 41 is preferably a one atmosphere chamber. Therefore, a penetrator 44 comprising a glass to metal seal may be provided through which the copper data line is passed from the termination assembly 12 into the interior of the chamber 41.

The hose of the subsea cable 17 is terminated within the termination assembly 13 and a data line 26, for example an optical fiber data line 26, is passed through the termination assembly 13 into the second chamber 42. Within the second chamber 42 the optical fiber data line 26 is supported by the fiber management unit 45. As described above, the second chamber 42 may be a pressure compensated chamber such that a pressure inside the chamber 42 corresponds essentially to a pressure prevailing in an environment of the subsea data switch 10. For example, the second chamber 42 may be filled with a fluid and may be in the fluid communication with the interior of the hose of the fiber optical subsea cable 17. For sealing the high pressure inside the second chamber 42 from the one atmosphere pressure in the first chamber 41, a penetrator 43 comprising a glass to glass seal may be provided between the first and second chamber through which the fiber optical data line 26 is passed. In the first chamber 41 the fiber optical data line 26 may be terminated at a media converter 33 which converts the optical signal of the fiber optical data line 26 into an electrical signal for processing in the data switching unit 30 and vice versa. A further copper or fiber optical data line of a further subsea cable may be passed by a further termination assembly into the first or second chambers 41, 42 as described above.

To sum up, the marinization for subsea installation of the ACS 10 is based upon several components. The ACS electronics, providing the data switching unit 30, may be provided as a printed circuit board (PCB) 30, and may be installed in a one-atmospheric chamber 41.

The technology behind the ACS may use a subsea cable termination. In particular, fiber terminations and respective seals and cable terminations may be used for terminating fiber optical or electrical subsea cables, respectively. The basic design comprises the one-atmospheric chamber housing 11, a PCB card 31, and a glass to metal penetrator 44 on the copper side and glass to glass penetrator 43 on the fiber side. This gives a field proven hermetical sealing for the one atmospheric chamber 41. The glass to glass and glass to metal penetrators provide through connections that are capable of withstanding large pressure differentials, for example such as between the ambient subsea environmental pressure and the pressure in the one atmosphere chamber 41.

Challenges in power consumption, electromagnetic compatibility (EMC), signal monitoring and conversions may be solved with a modular Printed Circuit Board (PCB) 31 specifically designed for installation in the subsea data switch.

With this configuration it is possible to interface several units or distribution channels to the ACS 10, and to distribute all connected channels either to topside or between units. Physical layers and communication interfaces can be configured to suit customer needs. A basic configuration including one PCB 31 installed in the subsea housing 11 can be supplied for example in the following configurations:

4 port 10/100BASE-TX switch:
  4 port Ethernet switch with electrical interfaces and 24 VDC separate power lines, or power over Ethernet. The electrical interfaces and choice of connectors can be adapted to customer needs. The ACS Ethernet switch with subsea cables (so called jumpers or jumper cables) can be configured with up to five hose exits from the housing 11. A hose may refers to a subsea cable 15-19 in form of a medium filled hose in which the data lines 25, 26 are disposed, in particular an oil filled hose. Each hose exit can consist of for example two Ethernet channels interfaced to a 12 way wet mateable connector, for example to a connector according to Level 3 of the Subsea Instrumentation Interface Standardization (SIIS Level 3).

2 port 10/100BASE-TX/2 port 100BASE-FX switch:
  2 ports with electrical interfaces and 2 ports with fiber optical interfaces. Power is supplied with 24 VDC separate power lines or power over Ethernet. The interfaces and choice of connectors can be adapted to customer needs. The ACS Ethernet switch with jumpers can be configured with up to five hose exits from the housing. The two Ethernet channels can be connected to one or two wet mateable electrical connectors, and the two fiber optical channels to one or two wet mateable fiber optical connectors.

In case of unused channels, these can be powered down to save power. If the subsea data switch 10 requires a higher number of channels, a plurality of subsea data switches 10 may be daisy chained to allow more channels to be connected to the same network. Monitoring of both fiber and copper Ethernet may be built in features. Status of communication lines can be used as live monitoring or for trending of communication channels.

The subsea data switch 10 may provide the following features:
  Designed to 3000 meter SW. 450 bar (Test pressure)
  Compliant with industrial EMC standards (ESD/EFT/Surge) on power and signal ports
  Minimal in-rush current due to under-voltage protection/lockout
  Immunity to external conducted disturbances due to input filtering
  Voltage level conversion (Input nominal voltage is 24 VDC)
  Low emissions due to output filtering
  Power supply over the Ethernet wires, no dedicated conductors are required for the input power
  Power distribution to consumers over Ethernet pairs with over current-protection and fault indication
  Power on reset
  Startup time <1 s
  Power consumption max 3 W
  Real time cable connectivity diagnostic
  Support of energy-efficient Ethernet (EEE)
  Configurable VLANs when delivered as an Ethernet switch
  Fiber communication wavelength can be changed according to the requirements
  Additional capacity of 4 power/signal lines up to 1000V through the ACS jumper The invention is not limited to the example embodiments described in the foregoing. Rather, other variants of the invention may also be derived herefrom by the person skilled in the art without departing from the subject matter of the invention.

The invention claimed is:

1. A subsea data switch, comprising:
  a subsea housing, including a pressure resistant first chamber maintained at an internal pressure, a data switching unit being disposed in the first chamber of the subsea housing;
  at least three termination assemblies for terminating at least three subsea cables to the subsea data switch, each of the at least three subsea cables including a data line, the data line of each of the at least three subsea cables being connected to the data switching unit; and
  at least one of
    at least one penetrator including a glass to metal seal for leading an electrical data line into the pressure resistant first chamber, and
    at least one penetrator including a glass to glass seal for leading an optical data line into the pressure resistant first chamber,
  wherein the data switching unit is configured to provide data switching between the data lines of the at least three subsea cables, wherein at least one subsea cable includes a hose surrounding the respective data line and a respective termination assembly assigned to the corresponding subsea cable is configured to receive and terminate the hose and to pass the respective data line without the surrounding hose to the data switching unit.

2. The subsea data switch of claim 1, wherein the subsea data switch is an Ethernet data switch, and wherein the data switching unit includes the Ethernet switch.

3. The subsea data switch of claim 1, further comprising:
a printed circuit board including electronic circuits disposed in the subsea housing and providing at least part of the data switching unit.

4. The subsea data switch of claim 1, wherein at least one of the data lines of the at least three subsea cables is a fiber optical data line, and wherein the data switching unit includes a media converter to convert between an optical signal of the fiber optical data line and an electrical signal.

5. The subsea data switch of claim 1, wherein the data switching unit includes an Ethernet switch having including at least four ports, said four ports including two ports each with the glass to metal seal for leading a respective electrical data line into the first chamber and two ports each with the glass to glass seal for leading a respective optical data line into the first chamber.

6. The subsea data switch according to of claim 1,
wherein the subsea housing is a cylindrical housing including a first end wall and a second end wall spaced apart along in a longitudinal axial direction;
wherein the pressure resistant first chamber includes a first end and a second end spaced apart along the longitudinal axis direction, wherein the second end of the first chamber is spaced apart from the second end wall of the subsea housing along the longitudinal axial direction.

7. The subsea data switch of claim 6,
wherein the at least three termination assemblies include a first termination assembly at the first end wall of the subsea housing and a second termination assembly at the second end wall of the subsea housing;
and wherein the penetrator including the glass to metal seal is at the first end of the first chamber and the penetrator including the glass to glass seal is at the second end of the first chamber and is spaced apart from the second termination assembly at the second end wall of the subsea housing;
wherein an outer diameter of the subsea housing is relatively smaller than ten times an outer diameter of one of the at least three subsea cables.

8. The subsea data switch of claim 7, wherein:
the second termination assembly is for at least one fiber optical subsea cable and is configured to receive and terminate the hose of the fiber optical subsea cable and to pass the data line of the fiber optical subsea cable without the surrounding hose to the data switching unit; and
the first termination assembly is for at least one electrical subsea cable and is configured to receiver and terminate the hose of the electrical subsea cable and to pass the data line of the electrical subsea cable without the surrounding hose to the data switching unit.

9. The subsea data switch of claim 7, wherein the glass to metal seal at the first end of the first chamber and the glass to glass seal at the second end of the first chamber are configured such that the internal pressure is maintained in the first chamber and the first chamber is hermetically sealed from outside the first chamber and within the subsea housing.

10. A subsea data communication cable harness, comprising:
the subsea data switch of claim 1; and
the at least three subsea cables, each of the at least three subsea cables including a respective data line,
the at least three subsea cables being terminated to the subsea data switch and the respective data lines, of the respective at least three subsea cables, being connected to the data switching unit of the subsea data switch.

11. The subsea data communication cable harness of claim 10, further comprising:
a first subsea wet mateable connector; mounted to a remote end of a first of the at least three subsea cables and configured to be connected to a first subsea device;
a second subsea wet mateable connector mounted to a remote end of a second of the at least three subsea cables and configured to be connected to a second subsea device; and
a third subsea wet mateable connector mounted to a remote end of a third of the at least three subsea cables and configured to be connected to a third subsea device.

12. The subsea data communication cable harness of claim 11, wherein at least one of:
the subsea cables include electrical data lines and are configured to facilitate communication between at least two of the first subsea device, the second subsea device and the third subsea device that are positioned within a threshold distance of each other; and
the subsea cables include optical data lines and are configured to facilitate communication between at least two of the first subsea device, the second subsea device and the third subsea device that are positioned beyond the threshold distance of each other.

13. The subsea data switch of claim 2, further comprising:
a printed circuit board including electronic circuits disposed in the subsea housing and providing at least part of the data switching unit.

14. The subsea data switch of claim 2, wherein at least one of the data lines of the at least three subsea cables is a fiber optical data line, and wherein the data switching unit includes a media converter to convert between an optical signal of the fiber optical data line and an electrical signal.

15. The subsea data switch of claim 3, wherein at least one of the data lines of the at least three subsea cables is a fiber optical data line, and wherein the data switching unit includes a media converter to convert between an optical signal of the fiber optical data line and an electrical signal.

16. The subsea data switch of claim 13, wherein at least one of the data lines of the at least three subsea cables is a fiber optical data line, and wherein the data switching unit includes a media converter to convert between an optical signal of the fiber optical data line and an electrical signal.

17. The subsea data switch of claim 1, wherein each subsea cable of the at least three subsea cables includes a corresponding hose surrounding the respective data line of the corresponding subsea cable, wherein a corresponding termination assembly, assigned to the corresponding subsea cable, is configured to receive and terminate the corresponding hose and to pass the respective data line without the surrounding hose to the data switching unit.

* * * * *